(12) United States Patent
Challa et al.

(10) Patent No.: US 8,477,887 B2
(45) Date of Patent: Jul. 2, 2013

(54) SYSTEMS AND METHODS PROVIDING FREQUENCY-DOMAIN AUTOMATIC GAIN CONTROL (AGC)

(75) Inventors: Raghu Narayan Challa, San Diego, CA (US); Brian Clarke Banister, San Diego, CA (US); Levent Aydin, San Diego, CA (US); Yuheng Huang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 277 days.

(21) Appl. No.: 12/971,839

(22) Filed: Dec. 17, 2010

(65) Prior Publication Data

US 2011/0150152 A1 Jun. 23, 2011

Related U.S. Application Data

(60) Provisional application No. 61/288,738, filed on Dec. 21, 2009, provisional application No. 61/295,591, filed on Jan. 15, 2010, provisional application No. 61/295,600, filed on Jan. 15, 2010.

(51) Int. Cl.
*H04L 27/08* (2006.01)

(52) U.S. Cl.
USPC ........... 375/345; 375/316; 375/259; 375/260; 375/285; 375/346

(58) Field of Classification Search
USPC .................. 375/316, 259, 260, 285, 345, 346
See application file for complete search history.

(56) References Cited

U.S. PATENT DOCUMENTS

| | | | | |
|---|---|---|---|---|
| 5,852,630 | A * | 12/1998 | Langberg et al. | 375/219 |
| 7,065,165 | B2 | 6/2006 | Heinonen et al. | |
| 7,822,153 | B2 * | 10/2010 | Song et al. | 375/345 |
| 2006/0079191 | A1 * | 4/2006 | Parssinen et al. | 455/226.1 |
| 2006/0222118 | A1 | 10/2006 | Murthy et al. | |
| 2008/0031387 | A1 | 2/2008 | Shin et al. | |
| 2009/0161804 | A1 | 6/2009 | Chrabieh et al. | |
| 2009/0310690 | A1 | 12/2009 | Lee | |
| 2010/0046679 | A1 * | 2/2010 | Kajakine et al. | 375/345 |
| 2010/0177857 | A1 * | 7/2010 | Huttunen et al. | 375/350 |

FOREIGN PATENT DOCUMENTS

| | | |
|---|---|---|
| GB | 2458542 A | 9/2009 |
| KR | 20070081381 A | 8/2007 |
| WO | WO2009080578 A1 | 7/2009 |

OTHER PUBLICATIONS

International Search Report and Written Opinion—PCT/US2010/061645, International Authority—European Patent Office—Feb. 21, 2011.

* cited by examiner

*Primary Examiner* — Siu Lee
(74) *Attorney, Agent, or Firm* — Kam T. Tam (57) ABSTRACT

A method for Automatic Gain Control (AGC) in a receiver is performed by a circuit having an inner loop and an outer loop. The method includes performing an outer loop energy detection, mitigating interference using the outer loop energy detection, and performing a frequency domain energy measurement in the inner loop. The method also includes adjusting a digital gain component in the inner loop and an analog gain component in the outer loop in response to the frequency domain energy measurement.

22 Claims, 6 Drawing Sheets

SYSTEMS AND METHODS PROVIDING FREQUENCY-DOMAIN AUTOMATIC GAIN CONTROL (AGC)

CROSS-REFERENCE TO RELATED APPLICATION

The present application claims the benefit of U.S. Provisional Patent Application No. 61/288,738, filed Dec. 21, 2009, and entitled "Frequency Domain AGC for OFDM System," U.S. Provisional Patent Application No. 61/295,591, filed Jan. 15, 2010, and entitled "Frequency Domain AGC for OFDM System," and U.S. Provisional Patent Application No. 61/295,600, filed Jan. 15, 2010, and entitled "Frequency Domain AGC for OFDM System," the disclosures of which are incorporated by reference herein in their entirety.

TECHNICAL FIELD

This disclosure generally relates to Automatic Gain Control (AGC) and, more specifically, to a double loop structure for performing AGC.

BACKGROUND

Automatic Gain Control (AGC) is currently used in conventional systems where an input signal is expected to fluctuate in power. In some conventional systems, AGC is used to compress a vast dynamic range of a received signal to fit into an input range of a downstream device, such as an analog-to-digital converter (ADC), thereby avoiding saturation and helping to ensure that a signal-to-quantization-noise ratio at the output of the ADC is acceptable. In some conventional devices, a goal of AGC is to provide a signal with a substantially constant average power for successive functional blocks. AGC can be used to make a receiver somewhat insensitive to signal power variation.

AGC is usually performed with an amplifier provided near the input of a receive signal path. The amplifier is controlled by feedback loop control logic that measures signal strength somewhere along the receive signal path and passes control signals back to the amplifier. However, for some systems that have digital and frequency domain components in the signal path, a single, analog amplifier near the signal input may not provide adequately robust AGC.

BRIEF SUMMARY

In one embodiment, a method for Automatic Gain Control (AGC) in a receiver is disclosed. The AGC is performed by a signal-receive circuit having an inner loop and an outer loop. The method includes performing an outer loop energy detection, mitigating interference using the outer loop energy detection, performing a frequency domain energy measurement in the inner loop, and adjusting a digital gain component in the inner loop and an analog gain component in the outer loop in response to the frequency domain energy measurement.

In another embodiment, an Automatic Gain Control (AGC) circuit provides automatic gain control in a receiver. The AGC circuit has AGC control logic, and an outer loop in communication with the AGC control logic. The outer loop has n outer loop energy detector communicating an outer loop energy estimate to the AGC control logic, and also has an analog amplifier. The AGC circuit also has an inner loop including a frequency domain energy estimator communicating a frequency domain energy estimate to the AGC control logic. The inner loop also has a digital gain component adjusted in response to the frequency domain energy estimate. The AGC control logic adjusts the analog amplifier in response to the frequency domain energy estimate and mitigates interference in response to the outer loop energy estimate.

According to another embodiment, an Automatic Gain Control (AGC) circuit provides AGC in a receiver. The AGC circuit has means for controlling gain in the AGC circuit, in which the controlling means are disposed in an inner loop of the AGC circuit and in an outer loop of the AGC circuit. The AGC circuit also has means in the outer loop for performing an outer loop energy estimation, in which the controlling means use the outer loop energy estimation to detect and mitigate interference from adjacent bands. The AGC circuit has means in the inner loop performing a frequency domain energy measurement. The controlling means adjust a digital gain component in the inner loop in response to the frequency domain energy measurement and adjust an analog amplifier in the outer loop in response to the frequency domain energy measurement.

In one embodiment, a computer program product has a computer readable medium tangibly recording computer program logic for performing Automatic Gain Control (AGC) on a received signal in a circuit with an inner loop and an outer loop. The computer program product includes code to receive an outer loop energy estimate of the received signal, code to use the outer loop energy estimate to detect and mitigate interference in the received signal, code to receive frequency domain energy information from the inner loop, and code to discern and apply respective gains in the inner loop and the outer loop using the received frequency domain energy information.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
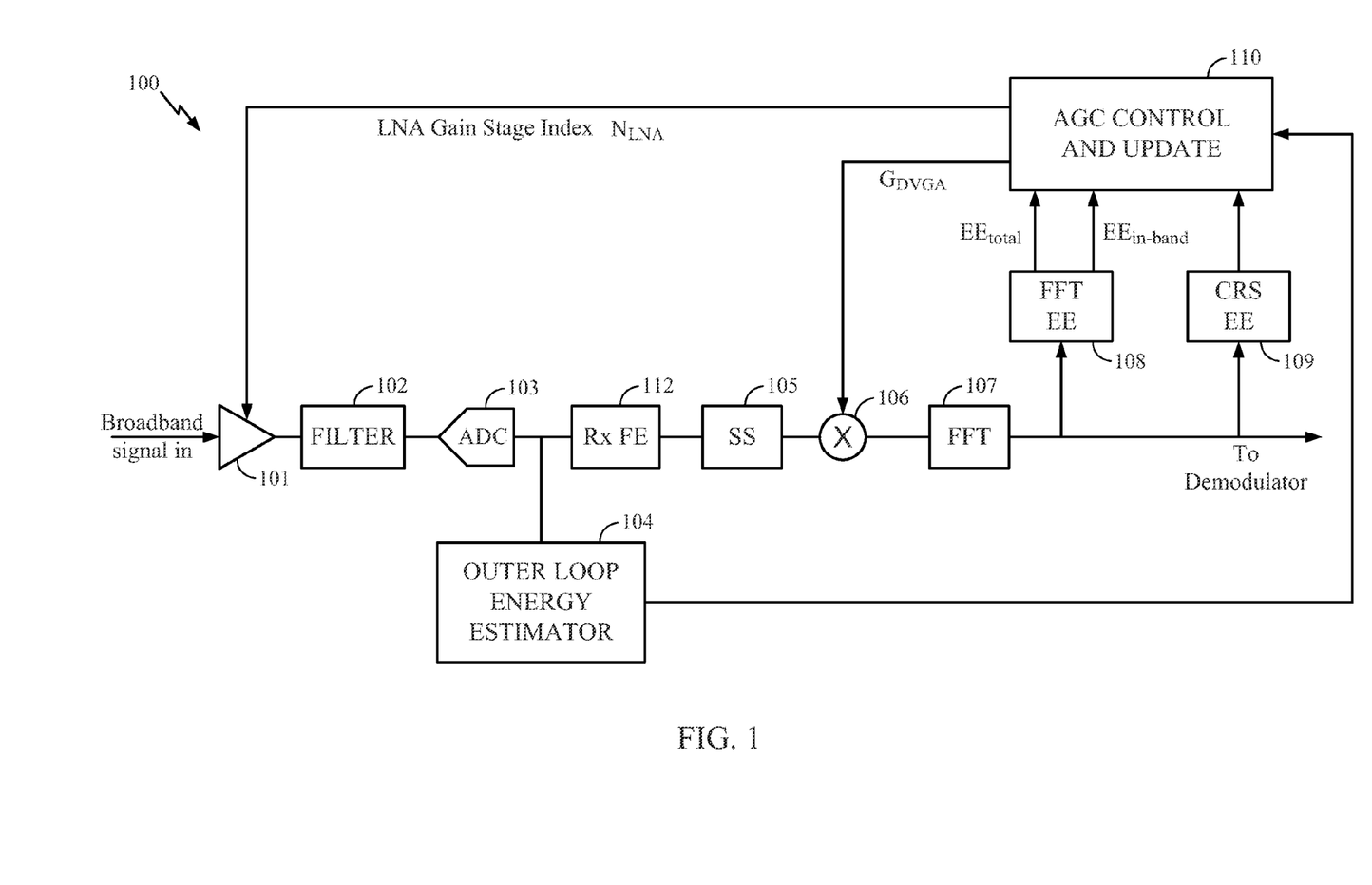
FIG. 1 is an illustration of an exemplary Automatic Gain Control (AGC) system according to one embodiment.

FIG. 1 is an illustration of an exemplary Automatic Gain Control (AGC) system 100 according to one embodiment. In some embodiments, the system 100 is implemented as an Orthogonal Frequency Division Multiplexing (OFDM) receiver, though the scope of embodiments is not so limited. The system 100 includes a Low Noise Amplifier (LNA) 101 at the beginning of the signal path. The LNA 101 receives a broadband signal, e.g., over the air from an antenna assembly. The LNA 101 is shown at the beginning of the signal path, but the scope of embodiments is not so limited. The broadband signal input into the LNA 101 may be already processed by one or more other components, such as filters (not shown), pre-amplifiers (not shown) and/or the like.

The broadband signal is fed to a filter 102 that can be used to decrease interference. An Analog-to-Digital Converter (ADC) 103 receives and digitizes the broadband signal, and the digitized signal is then passed to a front end filter 112 that does signal conditioning and further interference rejection. The conditioned signal is sent to a sample server 105, which can store and transmit time domain digital samples.

A Digital Variable Gain Amplifier (DVGA) 106 receives digital signals from the sample server 105 and applies a gain thereto. The DVGA 106 and the LNA 101 are two gain components that control the gain of the signal in the system 100, as described in more detail below. The DVGA 106 and the LNA 101 are described in these examples as applying a gain to signals, and it is understood that each such component 101, 106 may increase or decrease a power of a signal.

The digital signal output from the DVGA 106 is passed to an FFT engine 107, which uses a Fast Fourier Transform (FFT) to create a frequency domain signal from the time domain signal received from the DVGA 106. In some embodiments, the FFT engine 107 is replaced by an engine that performs another efficient time-to-frequency domain transform, such as a Z-transform or the like. Furthermore, in some embodiments, the DVGA 106 can be placed downstream of the FFT engine 107, rather than upstream as shown in FIG. 1.

The frequency domain signal is passed to a demodulator (not shown) where the signal is demodulated and possibly processed further into text, video, and/or audio. An FFT energy estimator 108 and a Cell-specific Reference Signal (CRS) estimator 109 provide two frequency-domain power metrics from the inner loop to the AGC control and update logic 110. The AGC control and update logic 110 may be implemented using a processor, such as a general-purpose processor, a Digital Signal Processor (DSP), a Application Specific Integrated Circuit (ASIC), and/or the like. An outer loop energy estimator 104 provides a time-domain energy estimate for the outer loop AGC control and update logic 110. In this example, the outer loop energy estimator 104 gives an energy estimation for the outer loop.

As explained in more detail below, the AGC control and update logic 110 controls the gain of the signals based, at least in part, on the frequency domain energy estimates from the FFT energy estimator 108, the CRS estimator 109, and the time domain energy estimate from the outer loop energy estimator 104. In the system 100, it is desired to adjust the signal power at the input of the ADC 103 so that the signal-to-quantization-noise ratio is maximized at the ADC output and ADC saturation is minimized. Similarly, it is desired to operate the FFT engine so that the signal power at its output is as close to an optimum operating setpoint as possible. These tasks are accomplished using continuous inner loop digital gain control in conjunction with discrete gain steps in the analog domain in the outer loop. The power of the signal at the ADC input is not a constant. In this example embodiment, the ADC output is compensated digitally using a DVGA loop (the inner loop) so that the variance of the DVGA output remains at or near a constant.

Of note in FIG. 1 is the inner loop and outer loop structure. The outer loop structure controls the LNA 101, and the inner loop structure controls the DVGA 106. In some embodiments, the LNA 101 provides a coarse gain component, and the DVGA 106 provides a finer gain component. Specifically, the outer loop takes into account total energy, including the interference from out-of-band sources, and the inner loop affects in-band signals primarily.

The energy estimators 108, 109 downstream from the FFT engine calculate at least two kinds of energy metrics. One such energy metric is an FFT energy estimate, and another metric is a CRS energy estimate. The CRS estimator 109 uses reference signals (e.g., pilot tones) to calculate the CRS estimate. In this embodiment, the CRS estimate is used to calculate the component of the in-band energy provided by the reference signals only. The FFT energy estimate (by the FFT energy estimator 108) is used to calculate total in-band energy. The FFT energy estimate and the CRS energy estimate are used by AGC control and update logic 110 to control the DVGA 106 to provide appropriate gain control. The outer loop energy estimator 104 is used to control the LNA 101.

The use of multiple energy estimates (FFT energy estimate and CRS energy estimate) helps to provide a stable reference that the AGC unit can monitor and track. The total received in-band energy varies over time as a result of varying allocation (or load) on the down link of a communication system (e.g. a cell) as well as energy received as interference from other communication systems (e.g. cells) that operate on the same radio channel.

The CRS energy estimator 109 provides a good reference for the energy received from a specific energy source because it is derived from cell specific reference signals (pilot tones) that can be discerned from other interfering systems. In addition, the cell specific reference signal energy does not depend on down link allocation. In general, cell specific reference signals may not be transmitted all the time. However, cell specific reference signal transmission power does not usually vary over time when they are transmitted.

The FFT energy estimator 108 on the other hand provides an estimate of the total received signal and interference energy that is within the bandwidth of the FFT processor 107. As such, the FFT energy estimator 108 can capture variances of received energy resulting from intermittent interfering signals as well as varying down link allocations (loading). The outer loop energy estimator 104 also provides the total received signal and interference energy.

As shown in FIG. 1, LNA gain $G_{LNA}$ is applied to the signal before the signal is input to the ADC 103. The LNA gain is represented by the LNA gain stage index $N_{LNA}$. With respect to digital gain $G_{DVGA}$, such gain is applied to the data at the input to the FFT engine 107. As can be seen, some energy estimation and the AGC update and control logic 110 are implemented after the FFT engine 107. Such configuration may provide one or more advantages. For instance, in the frequency domain, the symbol boundary is automatically taken into consideration in the energy estimates. Thus, in some embodiments it may be possible to achieve desired AGC even when the Rx front blocks before the sample server (in this case, the LNA 101, the filter 102, and the ADC 103) do not have symbol timing information for AGC/DVGA. Furthermore, energy estimation (EE) in the frequency domain can be used to detect the existence of interference by comparing energy measured over out of band frequencies to energy measured over in band frequencies.

The outputs of the energy estimators 108, 109 are fed into the AGC control and update logic 110 to perform AGC updates. Although the DVGA gain is applied after the sample server 105, the AGC is still causal because, for a given symbol, the current DVGA multiplier is derived from energy estimates that were made earlier in time.

In the signal path, energy estimation is carried out by the FFT energy estimator 108 independently for various subbands. For example for each OFDM symbol, there may be five EE outputs: Out-of-band left-side, In-band left-side, DC, In-band right-side, and Out-of-band right-side. The sum of all five items represents total received energy and denoted as $EE_{total}$, and the sum of In-band left-side and right-side energy represents in-band energy and is denoted as $EE_{in\text{-}band}$.

Figure 2:
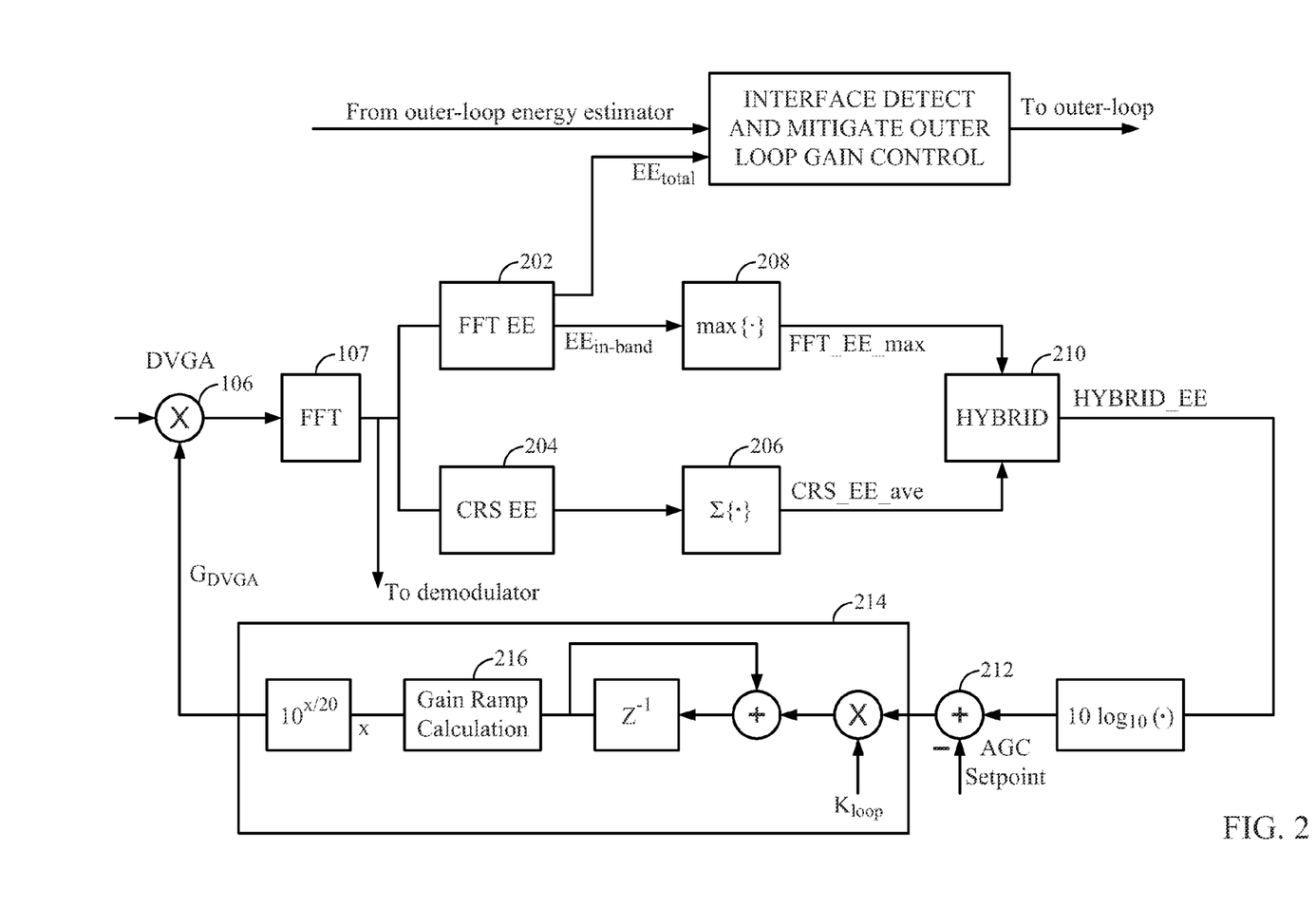
FIG. 2 shows an example configuration of the inner AGC loop of FIG. 1 in further detail according to one embodiment.

FIG. 2 shows an example configuration of the inner AGC loop of FIG. 1 in further detail according to one embodiment. In FIG. 2 the FFT EE 202 provides an FFT energy estimate for a given OFDM symbol n is denoted by FFT_EE[n] and is calculated as follows:

$$\text{FFT\_EE}[n] = \sum_{k \in \text{in-band tones}} |X[k,n]|^2 \quad (1.1)$$

In this equation X[k,n] represents the FFT output with frequency index k for OFDM symbol index n, and the summation is carried out over frequency indices that constitute in-band tones (i.e., tones that can be used for information transmission), excluding guard tones and DC.

The CRS EE 204 provides a CRS energy estimate for reference symbol m is denoted by CRS_EE[m] and is calculated as follows:

$$\text{CRS\_EE}[m] = \sum_{k \in \text{reference tones}} |X[k,m]|^2 \quad (1.2)$$

In this equation X[k,m] represents the FFT output with frequency index k for OFDM symbol index m which is known to contain reference tones as well as information tones (i.e., a reference symbol).

These per symbol energy measurements are further processed by the functional units 206 and 208 to calculate the following metrics, respectively:

$$\text{FFT\_EE\_max} = \max_{n \in \{0,\ldots,N_{sym}\}} \{\text{FFT\_EE}[n]\} \quad (1.3)$$

$$\text{CRS\_EE\_ave} = \left(\frac{1}{N_{refsym}}\right) \times \sum_{m \in \text{ref. symb.}} \text{CRS\_EE}[m]$$

Here, $N_{sym}$ denotes the number of OFDM symbols in a subframe and $N_{refsym}$ denotes the number of reference symbols in a subframe.

As mentioned before it is desirable to use an in-band energy estimation metric that is both independent of variations due to downlink allocation as well as capable of capturing the effect of intermittent co-channel interference (i.e. interferers operating on the same radio channel).

FFT_EE_max is a measure that captures the maximum measured in-band energy, therefore good for taking co-channel interferers into account. CRS_EE_ave is a measure of average energy received from a specific cell (i.e. serving cell) that is independent of variations due to changing downlink allocation.

Functional unit 210 receives the FFT_EE_max and CRS_EE_ave metrics and generates a hybrid energy estimation metric that can combine the benefits of the two individual energy metrics as follows:

$$\text{HYBRID\_EE} = \quad (1.4)$$
$$\begin{cases} \text{FFT\_EE\_max} & \text{if } \dfrac{\alpha \times \text{FFT\_EE\_max}}{\beta \times K_{full\_alloc} \times \text{CRS\_EE\_ave}} > 1 \\ K_{full\_alloc} \times \text{CRS\_EE\_ave} & \text{else} \end{cases}$$

Here, α and β are weighting coefficients between 0 and 1 which are used to emphasize or de-emphasize the individual energy metrics, and $K_{full\_alloc}$ is a scaling constant that is used to adjust the average CRS energy. The scaling constant is chosen so that the adjusted average CRS energy represents the expected energy from the serving cell assuming the downlink was fully allocated (i.e., all available tones are utilized).

The HYBRID_EE metric as defined above is determined by FFT_EE_max if there are co-channel interferers stronger than the serving cell, and otherwise it is determined by the adjusted CRS_EE_ave in case of no significant co-channel interferers and the downlink is less than fully allocated.

In FIG. 2 the inner loop DVGA gain control is driven by the HYBRID_EE metric. The control loop first calculates an error between the measured HYBRID_EE and the desired setpoint at functional unit 212. At the functional unit 214, this error is then accumulated using a single pole IIR filter whose response is controlled by a loop constant $K_{loop}$. This accumulated error determines the gain compensation $G_{DVGA}$ that is applied at the FFT input in a closed control loop. In general, the inner loop is updated at discrete time intervals when a new HYBRID_EE metric is available. For example, the HYBRID_EE calculation, accumulated error update and $G_{DVGA}$ gain determination may be done once every subframe (1 msec), though the scope of embodiments is not so limited.

In some embodiments that include a receiver in an OFDM modem, pilot-based channel estimation is applied to estimate the channel response in both the frequency and time domains through interpolation across the reference signals. For instance, the interpolation coefficients for a channel estimator may be chosen to minimize the mean square error (MMSE) between the actual channel and the channel estimates. Whichever methodology is applied to obtain the interpolation coefficients, in some OFDM systems that have an AGC process, the AGC gain updates may introduce discontinuity into the samples. Such discontinuities may adversely affect the channel estimation process as well as other demodulator algorithms.

Figure 3:
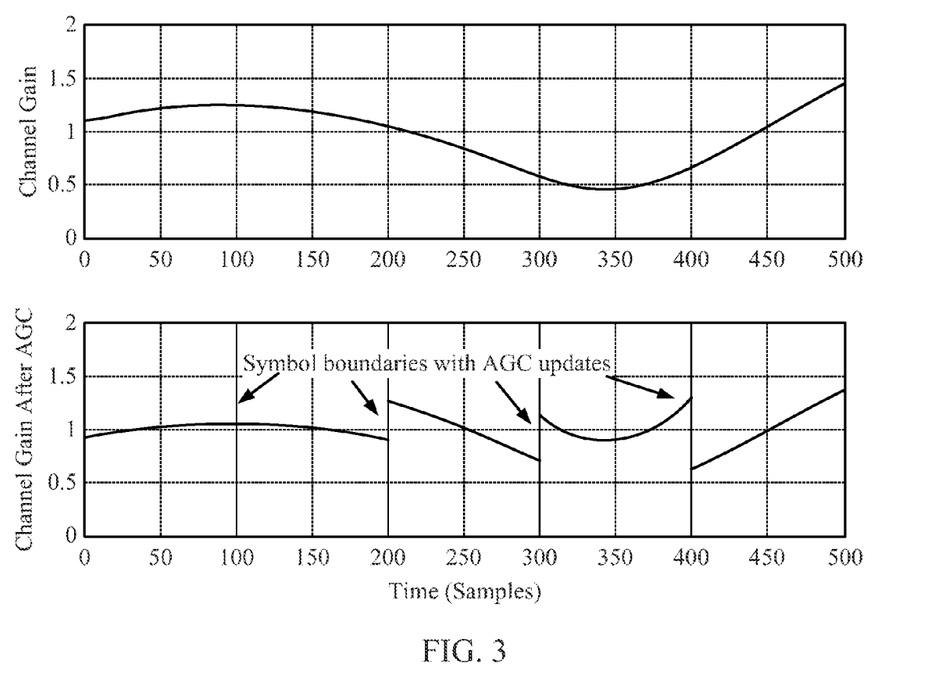
FIG. 3 is an illustration of discontinuities caused by gain adjustments.

This phenomenon is illustrated in FIG. 3, where a smoothly changing input signal (upper plot) is "chopped" up in pieces with discontinuities by the AGC updates (lower plot). When interpolating the reference signals, it may improve the performance of the channel estimation at the receiver if the discontinuities introduced by the AGC can be reversed or otherwise minimized. Various embodiments reduce or minimize discontinuities by adjusting the AGC gain as illustrated in FIG. 4.

Figure 4:
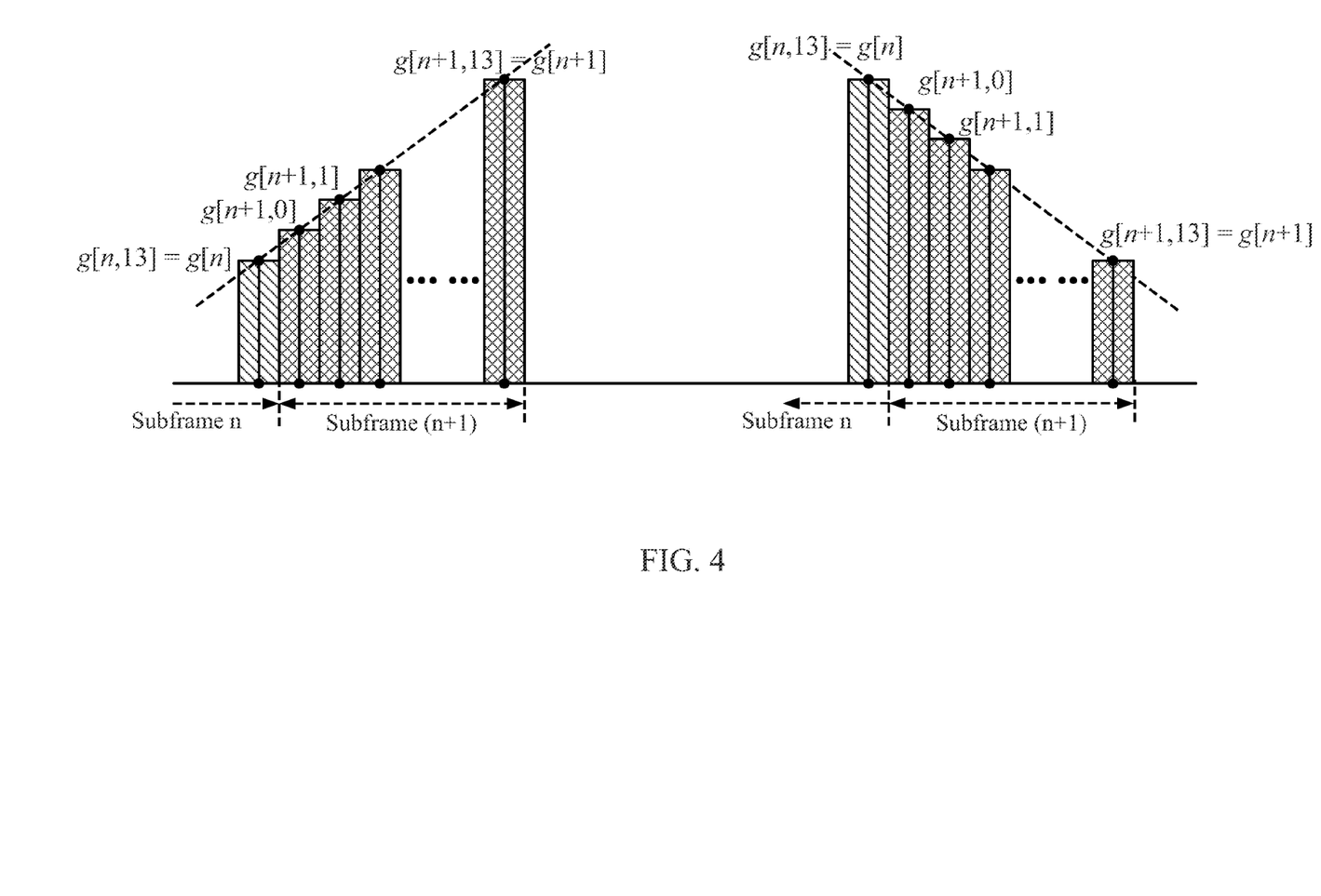
FIG. 4 is an illustration of a gain-ramping technique for reducing discontinuities according to one embodiment.

FIG. 4 is an illustration of a gain-ramping technique for reducing discontinuities according to one embodiment. The gain ramping technique may be performed, at least in part, by the functional unit 216 of FIG. 2. In FIG. 4, the AGC system adjusts the gain of the receiver such that the samples within one symbol (or, more precisely, within the FFT window) have a roughly constant power. For illustrative purposes, FIG. 4 assumes that each OFDM symbol has 100 samples, though the scope of embodiments is not so limited. Further in this embodiment, the gain adjustment includes the AGC effects of both the analog stages (e.g., the LNA of FIG. 1) and digital stages (e.g., the DVGA of FIG. 1).

In the technique of FIG. 4, instead of using the total gain g[n+1] for the entire subframe, the technique uses the linear interpolation between g[n] and g[n+1] for each of the OFDM symbols in the (n+1)th subframe, and the total gain to be applied to the m th OFDM symbol in the (n+1)th subframe is denoted as g[n+1,m]. Then, for each OFDM symbol, the adjusted digital gain is given by Equation (8).

$$g_{DVGA}[n+1,m]=g[n+1,m]-g_{LNA}[n+1] \quad (8)$$

The technique of FIG. 4 can effectively solve the discontinuity issue in some embodiments. The technique may be applied, for example, by an AGC control and update component.

Figure 5:
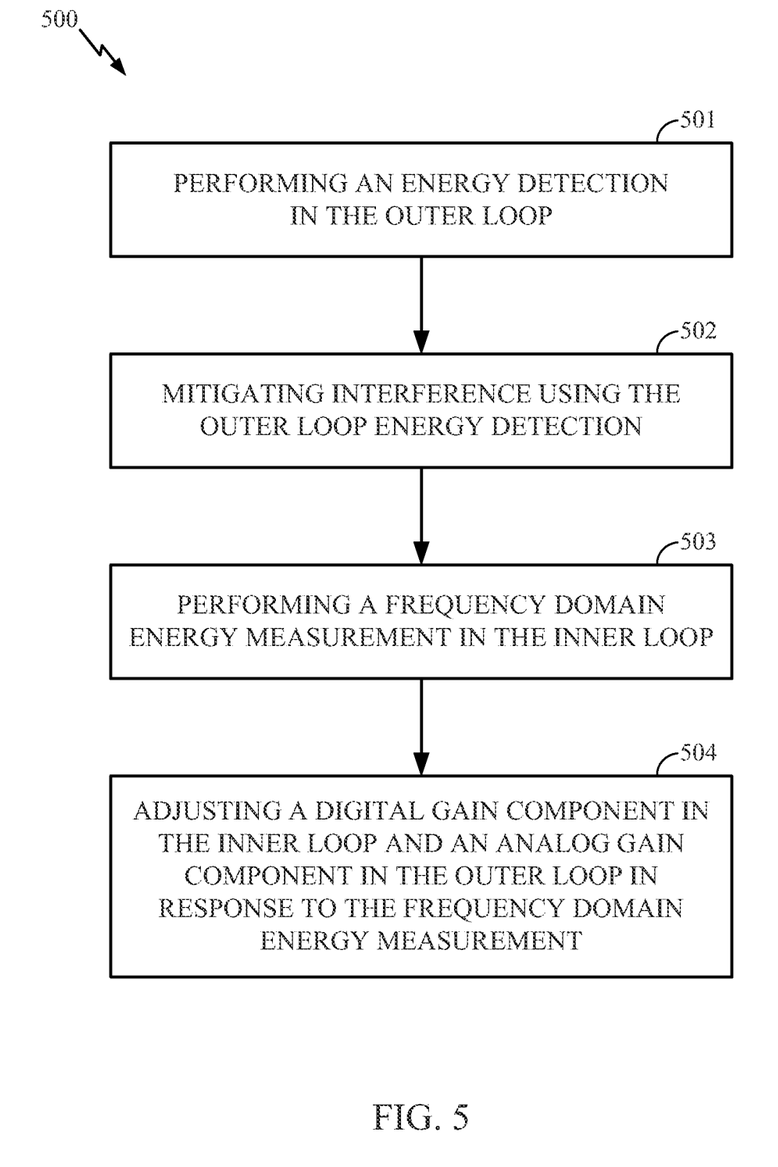
FIG. 5 is an illustration of an exemplary method adapted according to one embodiment.

FIG. 5 is an illustration of an exemplary method 500 adapted according to one embodiment. The method 500 may be performed, for example, by an AGC system, such as the system 100 of FIG. 1. The method 500 may be one of a number of processes performed by a larger system, such as a phone, computer, or other device that has an OFDM receiver. However, the method 500 is not limited to an OFDM system, as it can be implemented in any of a variety of dual-loop AGC systems.

In block 501, an energy estimation is performed in the outer loop. The outer loop energy estimation includes measuring an energy for a received signal in the signal path before out-of-band signals have been substantially removed. The outer loop energy estimation is performed in the digital domain in this embodiment, though other embodiments may perform the outer loop energy detection in the analog domain.

In block 502, the outer loop energy estimate from block 501 is used to mitigate interference. Mitigating interference is described in more detail below with respect to FIG. 6.

In block 503, a frequency domain energy measurement is performed in the inner loop. In this example embodiment, the frequency domain energy measurement includes an FFT energy estimate and a CRS energy estimate. CRS energy measurements are based on pilot tones in the signal and are included in some conventional systems. The FFT energy estimate measures various subbands independently. Block 503 may also include generating a hybrid energy estimation metric, such as is performed by the functional unit 210 of FIG. 2.

In block 504, AGC logic uses the frequency domain energy measurements to adjust the gain in the inner loop and in the outer loop as well. The outer loop may be controlled, at least in part, using the $EE_{total}$ metric calculated by the functional unit 202 of FIG. 2. The outer loop uses an analog gain component, for example, an LNA. The inner loop may be controlled, at least in part, using the a hybrid metric calculated by the functional unit 210 of FIG. 2. The inner loop uses a digital gain component, such as a DVGA. Example logic to apply the gain control in the inner and outer loops is shown in block diagram form in FIG. 2.

The method 500 is shown as a series of discrete actions, but the scope of embodiments is not so limited. Various embodiments may add, omit, rearrange, or modify actions. For instance, in many embodiments, mitigation of interference is performed concurrently with gain adjustment.

Figure 6:
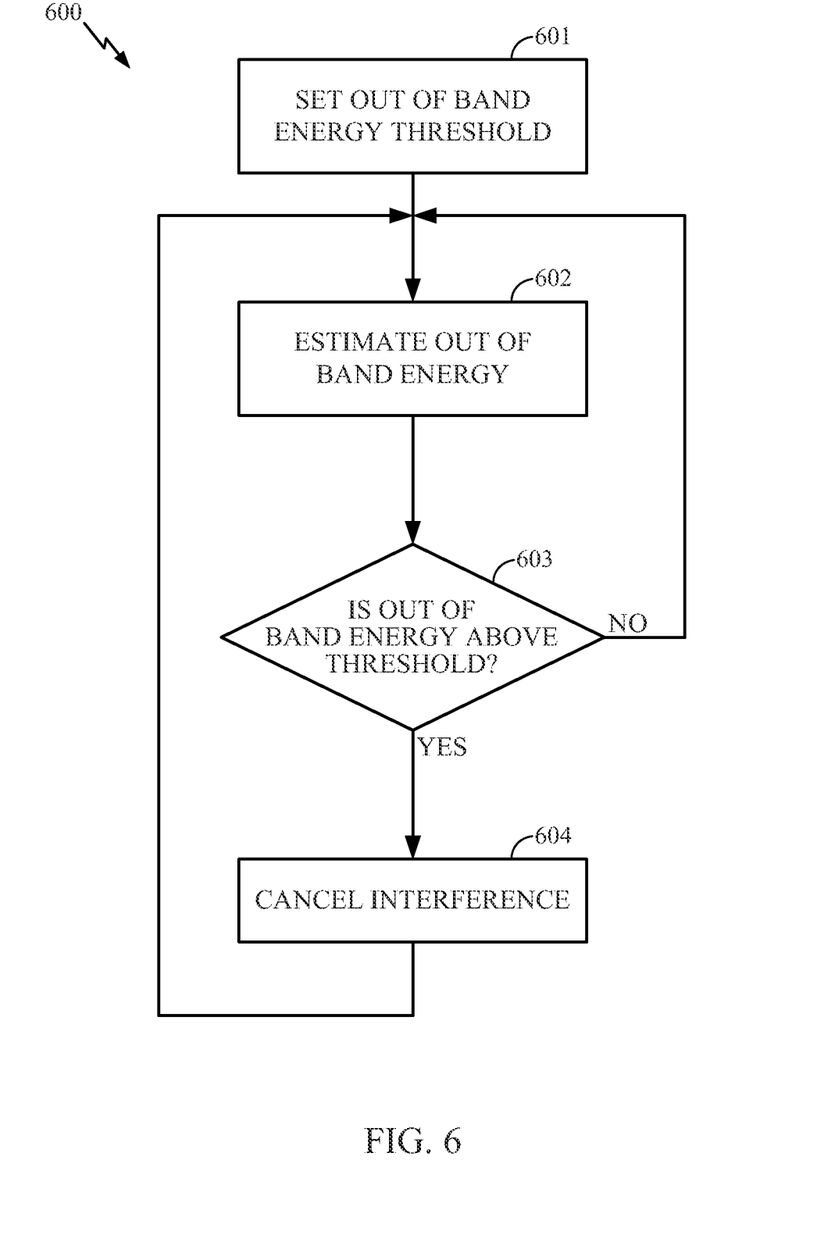
FIG. 6 is an illustration of an exemplary method adapted according to one embodiment.

FIG. 6 is an illustration of an exemplary method 600 adapted according to one embodiment. The method 600 may be performed, for example, by an AGC system, such as the system 100 of FIG. 1. Like the method of FIG. 5, the method 600 may be one of a number of processes performed by a larger system, such as a phone, computer, or other device that has an OFDM receiver, but the scope of embodiments is not limited to an OFDM system.

In block 601, an out-of-band energy threshold is set, where out-of-band energy is a form of interference. The threshold can be set in any way, including automatically, adaptively, manually by a user, or the like. In block 602, the out-of-band energy is estimated. In the example of FIG. 1, the outer loop energy estimator provides a time domain measure of total signal energy at the output of the ADC, such total energy including energy attributable to frequency bands other than the particular band of interest. Further in FIG. 1, the FFT energy estimator 107 provides an in-band energy estimate and a total energy estimate. Processing logic uses the outer loop energy estimate and the FFT energy estimates to calculate a value for out-of-band energy.

When out-of-band energy exceeds a threshold, the AGC device can assume that some amount of interference exists, and the extent of the interference can be discerned from the out-of-band energy level. In block 603, it is discerned whether the out-of-band energy exceeds the threshold. If the out-of-band does not exceed the threshold, then the method 600 may end or may return to block 602. If the out-of-band energy does exceed the threshold, then the out-of-band energy is attenuated or otherwise effectively removed in block 604. In one technique, AGC logic controls a filter to attenuate the out-of-band energy. In another technique, a Windowed Overlap and Add function is used within the FFT processor. The scope of embodiments is not limited to any technique for effectively removing interference. After block 604, the method 600 may end or may return to block 602. In any event, the method 600 may be performed continually, periodically, on command, or at any other time. Additionally, various embodiments may add, omit, rearrange, or modify actions.

Various embodiments also provide interference detection and cancellation. The energy metrics mentioned above can provide an estimate of total energy and in-band energy. Such estimates can also be used to derive out-of-band energy. As mentioned above, the outer loop can include an interference filter (not shown) that blocks, reduces, or minimizes out-of-band energy. Furthermore, various embodiments may include a Windowed Overlap and Add function within the FFT processor that can mitigate adjacent channel interference continuously or when interference is discerned to be higher than a given threshold.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Moreover, the previous description of the disclosed implementations is provided to enable any person skilled in the art to make or use the present disclosure. Various modifications to these implementations will be readily apparent to those skilled in the art, and the generic principles defined herein may be applied to other implementations without departing from the spirit or scope of the disclosure. Thus, the present disclosure is not intended to be limited to the features shown herein but is to be accorded the widest scope consistent with the principles and novel features disclosed herein.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for automatic gain control in a receiver, the automatic gain control performed by a signal-receive circuit having an inner loop circuit and an outer loop circuit, the method comprising:
    performing an outer loop energy detection;
    mitigating interference using the outer loop energy detection including setting a threshold for out-of-band energy;
    performing a frequency domain energy measurement in the inner loop circuit; and
    adjusting a digital gain component in the inner loop circuit and an analog gain component in the outer loop circuit in response to the frequency domain energy measurement.

2. The method of claim 1 performed by an orthogonal frequency division multiplexing receiver.

3. The method of claim 1 in which mitigating interference includes at least one of applying a filter to a broadband signal and applying a windowed overlap and add function to a broadband signal.

4. The method of claim 1 in which mitigating interference comprises:
    calculating the out-of-band energy using at least one of the outer loop energy detection and the frequency domain energy measurement; and
    discerning that the out-of-band energy exceeds the threshold.

5. The method of claim 1 in which performing a frequency domain energy measurement comprises:
    calculating a total frequency domain energy and a respective energy for individual subbands of a signal.

6. The method of claim 1 in which performing a frequency domain energy measurement includes performing a cell-specific reference signal estimation, performing a fast Fourier transform energy estimation, and using information from the cell-specific reference signal estimation and the fast Fourier transform energy estimation to create a hybrid energy estimation.

7. An automatic gain control circuit to provide automatic gain control in a receiver, the automatic gain control circuit comprising:
    an automatic gain control control logic processor;
    an outer loop circuit in communication with the automatic gain control control logic processor and including an outer loop energy detector communicating an outer loop energy estimate to the automatic gain control control logic processor, the outer loop circuit further including an analog amplifier; and
    an inner loop circuit including a frequency domain energy estimator communicating a frequency domain energy estimate to the automatic gain control control logic processor, the inner loop circuit further including a digital gain component adjusted in response to the frequency domain energy estimate;
    the automatic gain control control logic processor adjusting the analog amplifier in response to the frequency domain energy estimate and mitigating interference in response to the outer loop energy estimate including setting a threshold for out-of-band energy.

8. The automatic gain control circuit of claim 7 in which the frequency domain energy estimate includes information from at least one of:
- a fast Fourier transform energy estimate;
- a cell-specific reference signal energy estimate; and
- a hybrid energy estimate produced from the fast Fourier transform energy estimate and the cell-specific reference signal energy estimate.

9. The automatic gain control circuit of claim 8 further comprising a fast Fourier transform engine in the inner loop circuit disposed between the digital gain component and the frequency domain energy estimator, the automatic gain control circuit configured so that the analog amplifier and the digital gain component are adjusted in a time domain.

10. The automatic gain control circuit of claim 7 in which the automatic gain control control logic processor is operable to estimate out-of-band energy and in-band energy, and further in which the out-of-band energy is used to detect and mitigate interference.

11. The automatic gain control circuit of claim 10 in which the interference is mitigated using at least one of a filter and a windowed overlap and add function.

12. The automatic gain control circuit of claim 7 operably disposed in an orthogonal frequency division multiplexing receiver.

13. An automatic gain control circuit to provide automatic gain control in a receiver, the automatic gain control circuit comprising:
- means for controlling gain in the automatic gain control circuit, the controlling means disposed in an inner loop circuit of the automatic gain control circuit and in an outer loop circuit of the automatic gain control circuit;
- means in the outer loop circuit for performing an outer loop energy estimation, the controlling means using the outer loop energy estimation to detect and mitigate interference from adjacent bands including means for setting a threshold for out-of-band energy; and
- means in the inner loop circuit for performing a frequency domain energy measurement;
- the controlling means adjusting a digital gain component in the inner loop circuit in response to the frequency domain energy measurement and adjusting an analog amplifier in the outer loop circuit in response to the frequency domain energy measurement.

14. The automatic gain control circuit of claim 13 in which the frequency domain energy measurements are based, at least in part, on at least one of:
- a fast Fourier transform energy estimate;
- a cell-specific reference signal energy estimate; and
- a hybrid energy estimate produced from the fast Fourier transform energy estimate and the cell-specific reference signal energy estimate.

15. The automatic gain control circuit of claim 14 in which the amplifier and the digital gain component are adjusted in a time domain.

16. The automatic gain control circuit of claim 13 further including:
- means for estimating out-of-band energy and in-band energy; and
- means for detecting and mitigating the interference using the out-of-band energy.

17. The automatic gain control circuit of claim 16 in which the detecting and mitigating means includes at least one of a filter and a windowed overlap and add function.

18. The automatic gain control circuit of claim 13 operably disposed in an orthogonal frequency division multiplexing receiver.

19. The automatic gain control circuit of claim 13 in which the analog amplifier comprises a low noise amplifier.

20. A computer program product having a non-transitory computer readable medium tangibly recorded with computer program logic for performing automatic gain control on a received signal in a circuit with an inner loop circuit and an outer loop circuit, the computer program product comprising:
- code to receive an outer loop energy estimate of the received signal;
- code to use the outer loop energy estimate to detect and mitigate interference in the received signal including setting a threshold for out-of-band energy;
- code to receive frequency domain energy information from the inner loop circuit; and
- code to discern and apply respective gains in the inner loop circuit and the outer loop circuit using the received frequency domain energy information.

21. The computer program product of claim 20 in which the code to mitigate interference comprises at least one of:
- code to apply a filter to the received signal; and
- code to apply a windowed overlap and add function to the received signal.

22. The computer program product of claim 20 in which the code to detect interference comprises:
- code to calculate the out-of-band energy using the outer loop energy estimate and the frequency domain energy information; and
- code to discern that the out-of-band energy exceeds the threshold.

* * * * *